United States Patent
Inbe

(10) Patent No.: US 6,864,526 B2
(45) Date of Patent: Mar. 8, 2005

(54) CAPACITOR WITH VIA PLUGS FORMING FIRST AND SECOND ELECTRODES IN A MULTILAYER WIRING STRUCTURE OF A SEMICONDUCTOR DEVICE

(75) Inventor: Takashi Inbe, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/337,827

(22) Filed: Jan. 8, 2003

(65) Prior Publication Data

US 2004/0043556 A1 Mar. 4, 2004

(30) Foreign Application Priority Data

Aug. 30, 2002 (JP) .......................... 2002-253233

(51) Int. Cl.[7] .................. H01L 27/108; H01L 29/76; H01L 29/94
(52) U.S. Cl. .................. 257/300; 257/295; 257/296; 257/303; 257/306
(58) Field of Search .................. 257/295, 396, 257/300, 303, 306, 309, 758

(56) References Cited

U.S. PATENT DOCUMENTS

| | | | | |
|---|---|---|---|---|
| 6,313,003 B1 | * | 11/2001 | Chen | 438/396 |
| 6,492,226 B1 | * | 12/2002 | Hsue et al. | 438/253 |
| 2002/0163029 A1 | * | 11/2002 | Dirnecker et al. | 257/306 |
| 2003/0027385 A1 | * | 2/2003 | Park et al. | 438/253 |
| 2003/0075747 A1 | * | 4/2003 | Kim | 257/295 |

FOREIGN PATENT DOCUMENTS

| | | |
|---|---|---|
| JP | 2000-228497 | 8/2000 |
| JP | 2001-167974 | 6/2001 |
| JP | 2001-237375 | 8/2001 |

* cited by examiner

Primary Examiner—Mary Wilczewski
Assistant Examiner—Monica Lewis
(74) Attorney, Agent, or Firm—Oblon, Spivak, McClelland, Maier & Neustadt, P.C.

(57) ABSTRACT

A capacitor which can be manufactured easily without an addition of photo masks and manufacturing processes is obtained.

The capacitor has a plural via plugs (1a to 1c) which function as a first electrode and a plural via plugs (2a to 2c) which function as a second electrode. The via plugs (1a to 1c) are formed in a row along an X direction, and similarly, the via plugs (2a to 2c) are also formed in a row along the X direction. The capacitor is formed in a multilayer wiring structure of a semiconductor device, and the via plugs (1a to 1c) and the via plugs (2a to 2c) face each other with part of an interlayer insulating film between. Part of the interlayer insulating film which is put between the via plugs (1a to 1c) and the via plugs (2a to 2c) function as a capacitor dielectric film.

7 Claims, 7 Drawing Sheets

US 6,864,526 B2

CAPACITOR WITH VIA PLUGS FORMING FIRST AND SECOND ELECTRODES IN A MULTILAYER WIRING STRUCTURE OF A SEMICONDUCTOR DEVICE

BACKGROUND OF THE INVENTION

1. Field of the Invention

The present invention relates to a structure of a capacitor, and more particularly, it relates to a structure of a MIM (Metal Insulator Metal) type capacitor formed in a multilayer wiring structure of a semiconductor integrated circuit.

2. Description of the Background Art

An analog device is composed of resists, coils, condensers and so on, and a logic device is composed of MOS transistors and so on. In recent years, a formation of both the analog device and the CMOS logic device in a same chip, that is, a realization of one-chipped analog logic device is studied.

Conventionally, in a semiconductor device which the analog logic device is to be one-chipped, another photo mask has to be added to form a MIM capacitor. For example, 2 pieces in amount of the photo mask have to be added, one is for a processing of a lower electrode of the capacitor and another is for a processing of an upper electrode of the capacitor.

Besides, techniques in regard to the semiconductor device including the capacitor are described in Japanese Patent Application Laid-Open No. 2001-167974, Japanese Patent Application Laid-Open No. 2001-237375 and Japanese Patent Application Laid-Open No. 2000-228497.

However, according to such a conventional method of manufacturing the capacitor, a problem arises that a manufacturing cost increases which is caused by multiplication of the number of photo masks to be needed and of manufacturing processes.

SUMMARY OF THE INVENTION

It is an object of the present invention to obtain a capacitor which can be manufactured easily without an addition of photo masks and manufacturing processes.

According to the present invention, a capacitor is formed in a multilayer wiring structure of a semiconductor device, and includes an interlayer insulating film, a first via plug, a second via plug, a first wiring and a second wiring. The first via plug is formed in the interlayer insulating film and functions as a first electrode of the capacitor. The second via plug is formed in the interlayer insulating film, faces the first via plug with part of the interlayer insulating film between and functions as a second electrode of the capacitor. The first wiring is connected with only one of an upper surface and a lower surface of the first via plug. The second wiring is connected with only one of an upper surface and a lower surface of the second via plug.

The capacitor is composed using the first and the second via plugs formed in a multilayer wiring structure. Accordingly, in a process of forming the via plug which is connected electrically with a transistor in the multilayer wiring structure, by means of changing a pattern of a photo mask, the first and the second via plugs can be formed altogether. Therefore, the capacitor can be manufactured easily without an addition of photo masks and manufacturing processes.

Moreover, the first and the second wirings to operate each electric potential of the first and the second electrodes of the capacitor are connected with only one of each upper surface and each lower surface of the first and the second via plugs. Accordingly, the number of wirings to be formed in the multilayer wiring structure can be reduced. As a result, an occurrence of a defect caused by an extraneous substance and so on can be controlled in process of carrying out a manufacturing process, and thus an increase of a yield can be practicable.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiment 1.

Figure 1:
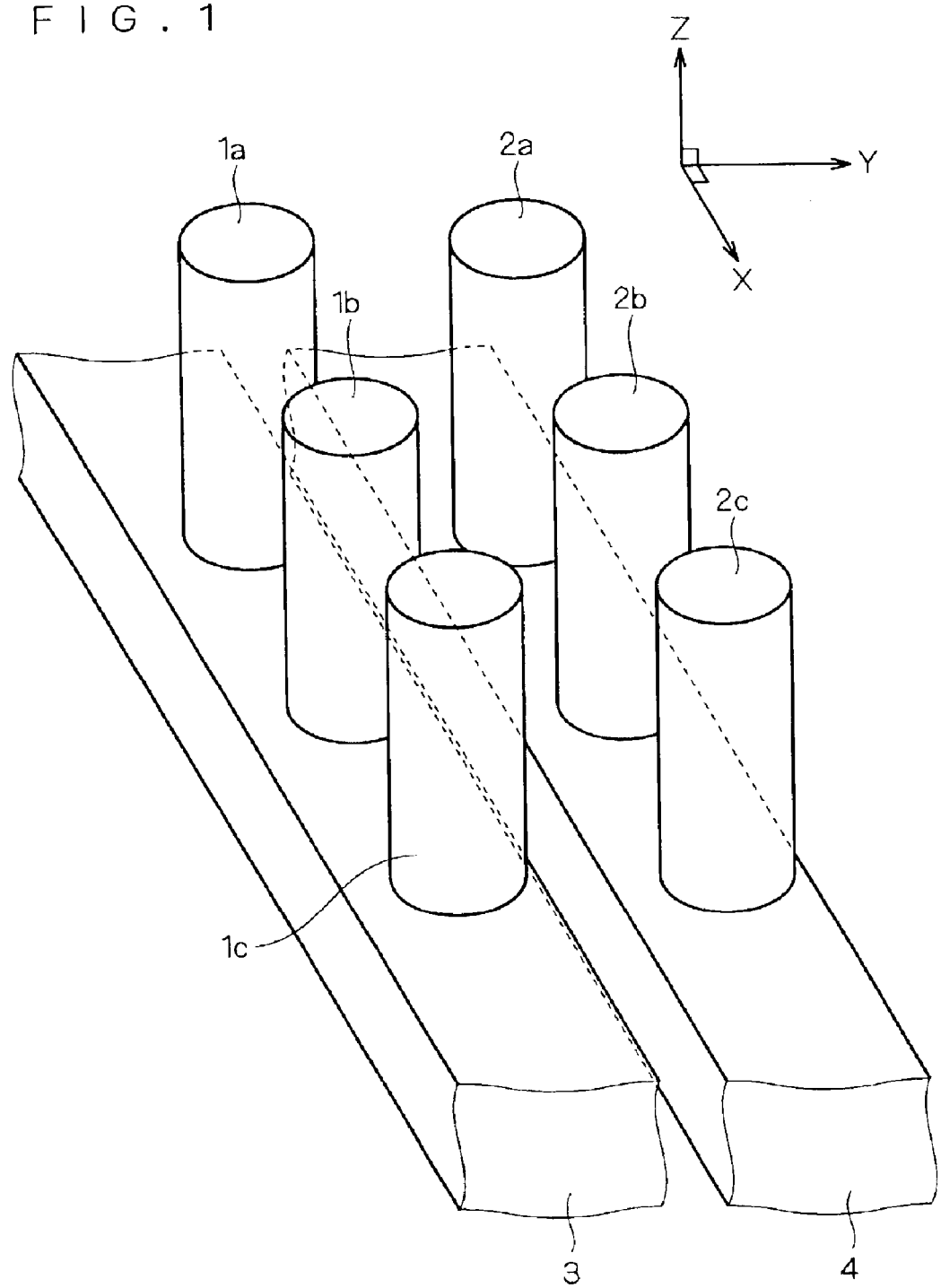
FIG. 1 is a perspective view schematically illustrating a structure of the capacitor according to a preferred embodiment 1 of the present invention.

FIG. 1 is a perspective view schematically illustrating a structure of the capacitor according to the preferred embodiment 1 of the present invention. The capacitor has a plural via plugs 1a to 1c which function as a first electrode and a plural via plugs 2a to 2c which function as a second electrode. The via plugs 1a to 1c are formed in a row along an X direction, and similarly, the via plugs 2a to 2c are also formed in a row along the X direction. The capacitor is formed in a multilayer wiring structure of a semiconductor device, and the via plugs 1a to 1c and the via plugs 2a to 2c face each other with a part of an interlayer insulating film (not shown in FIG. 1) between. For example, the via plug 1a and the via plug 2a face each other in a row along a Y direction in FIG. 1. Part of the interlayer insulating film which is put between the via plugs 1a to 1c and the via plugs 2a to 2c function as a capacitor dielectric film. In the present preferred embodiment 1, the via plugs 1a to 1c and 2a to 2c are all composed of a metal such as tungsten, aluminum and so on, and a MIM type capacitor is composed by them.

The via plugs 1a to 1c are connected with a wiring 3, and the via plugs 2a to 2c are connected with a wiring 4. The wirings 3 and 4 are both extended along the X direction. Moreover, in the present preferred embodiment 1, the wirings 3 and 4 are composed of a metal such as aluminum and so on. An upper surface of the wiring 3 is in contact with each lower surface of the via plugs 1a to 1c, and an upper surface of the wiring 4 is in contact with each lower surface of the via plugs 2a to 2c. The wirings 3 and 4 are wirings to operate each electric potential of a first electrode and a second electrode of the capacitor. Wirings are not connected with each upper surface of the via plugs 1a to 1c and 2a to 2c.

Besides, in FIG. 1, an example that three via plugs 1a to 1c and 2a to 2c are respectively connected with the wirings 3 and 4 is illustrated, however, the number of the via plug is not limited to this, but it is available so long as one or more via plugs are connected with the wirings 3 and 4, respectively.

Figure 2:
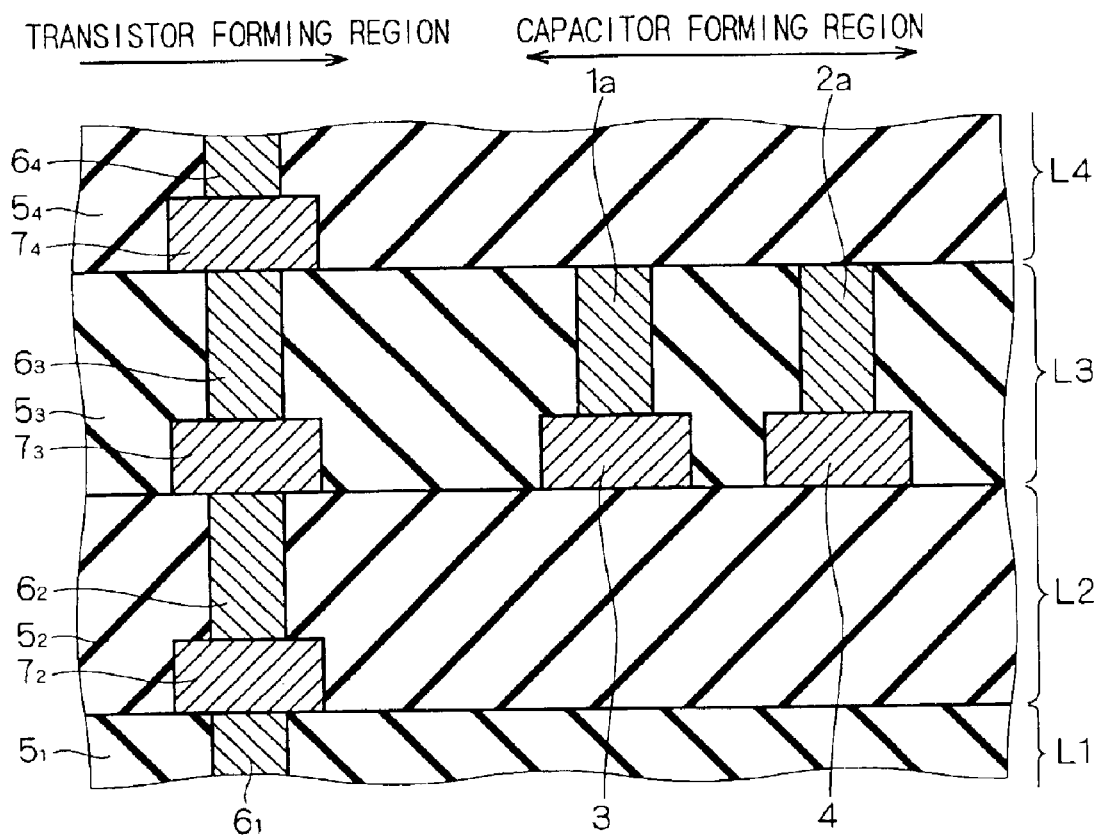
FIG. 2 is a cross-sectional view illustrating a sectional structure of the capacitor shown in FIG. 1.

FIG. 2 is a cross-sectional view illustrating a sectional structure of the capacitor viewed from the X direction shown in FIG. 1 with regard to the parts where the via plugs 1a and 2a are formed. In FIG. 2, besides a capacitor forming region where the capacitor is formed, a transistor forming region where a transistor is formed is also described. However, the transistor itself is not shown in the transistor forming region in FIG. 2, but only wiring which are electrically connected with the transistor are illustrated.

The semiconductor device includes the multilayer wiring structure which plural wiring layers L1 to L4 are laminated in this order. The wiring layers L1 to L4 have interlayer insulating films $5_1$ to $5_4$ which are composed of a silicon oxide film and so on, respectively. In the capacitor forming region, the capacitor which is shown in FIG. 1 is formed in the wiring layer L3. The via plug 1a and the via plug 2a face each other with part of the interlayer insulating film $5_3$ between. Part of the interlayer insulating film $5_3$ which is put between the via plug 1a and the via plug 2a functions as a capacitor dielectric film.

In the transistor forming region, via plugs $6_1$ to $6_4$ which are composed of a metal such as tungsten, aluminum and so on are formed in the wiring layers L1 to L4, respectively. Moreover, in the wiring layers L2 to L4, wirings $7_2$ to $7_4$ which are composed of a metal such as aluminum and so on are formed, respectively.

The wirings 3, 4 and $7_3$ are all formed on the interlayer insulating film $5_2$, and it is possible to form them by the same process. Moreover, the via plugs 1a, 2a and $6_3$ are all formed in the interlayer insulating film $5_3$, and it is possible to form them by the same process.

Figure 3:
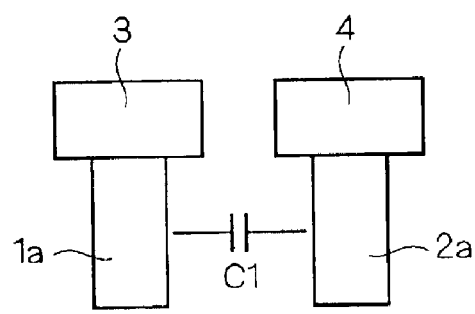
FIG. 3 is a schematic view illustrating an example of a modification of the capacitor according to the preferred embodiment 1 of the present invention.

FIG. 3 is a schematic view illustrating an example of a modification of the capacitor according to the present preferred embodiment 1. With regard to an example shown in FIGS. 1 and 2, the wirings 3 and 4 are respectively connected with each lower surface of the via plugs 1a and 2a, however, as shown in FIG. 3, the wirings 3 and 4 can respectively be connected with each upper surface of the via plugs 1a and 2a. In this case, wirings are not connected with each lower surface of the via plug 1a and 2a. As shown in FIG. 3, a capacitance C1 is composed between the via plug 1a and the via plug 2a which face each other.

In such a manner, according to the capacitor concerning with the present preferred embodiment 1, the MIM type capacitor is composed using the via plugs 1a to 1c and 2a to 2c formed in the multilayer wiring structure. Accordingly, in a process of forming the via plug which is connected electrically with the transistor in the multilayer wiring structure, by means of changing a pattern of a photo mask, the via plugs 1a to 1c and 2a to 2c can be formed altogether. Therefore, the capacitor can be manufactured easily without an addition of photo masks and manufacturing processes.

Moreover, the wirings 3 and 4 to operate each electric potential of the first and the second electrodes of the capacitor are connected with only one of each upper surface and each lower surface of the via plugs 1a to 1c and 2a to 2c. Accordingly, compared with a case that the wirings are connected with both the upper surface and the lower surface, the number of wirings to be formed in the multilayer wiring structure can be reduced. As a result, an occurrence of a defect caused by an extraneous substance and so on can be controlled in process of carrying out a manufacturing process, and thus an increase of a yield can be practicable.

Preferred Embodiment 2.

Figure 4:
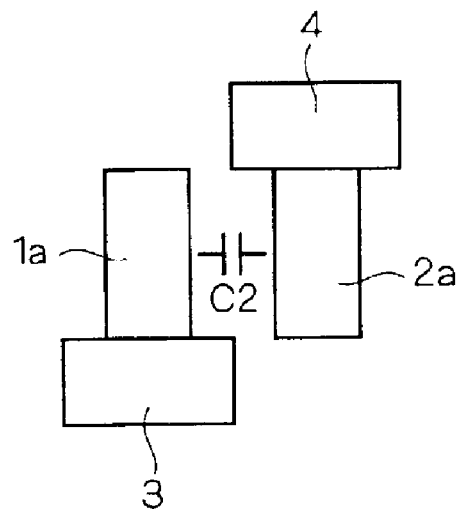
FIG. 4 is a schematic view illustrating a structure of the capacitor according to a preferred embodiment 2 of the present invention.

FIG. 4 is a schematic view illustrating a structure of the capacitor according to a preferred embodiment 2 of the present invention corresponding to FIG. 3. The wiring 3 is connected with the lower surface of the via plug 1a, and besides, the wiring 4 is connected with the upper surface of the via plug 2a. Referring to FIGS. 2 and 4, the wiring 3 shown in FIG. 4 can be formed in a same process with the wiring $7_3$ shown in FIG. 2, and the wiring 4 shown in FIG. 4 can be formed in a same process with the wiring $7_4$ shown in FIG. 2. Besides, in contrast with an example shown in FIG. 4, the wiring 3 can be connected with the upper surface of the via plug 1a, and the wiring 4 can be connected with the lower surface of the via plug 2a.

In such a manner, according to the capacitor concerning with the present preferred embodiment 2, the wiring 3 and the wiring 4 are not formed in the same wiring layer. Accordingly, there is no risk a side surface of the wiring 3 and a side surface of the wiring 4 being in touch with each other and therefore, the via plug 1a and the via plug 2a can be formed putting closer to each other than that of the preferred embodiment 1 described above. As a result, a capacitance C2 which is composed between the via plug 1a and the via plug 2a enlarges more than the capacitance C1 shown in FIG. 3, and thus, comparing with the preferred embodiment 1 as described above, the capacitance enlargement of the capacitor can be devised.

Preferred Embodiment 3.

In the preferred embodiments 1 and 2 described above, the capacitor formed in the multilayer wiring structure in which metal plugs such as tungsten and so on and metal wirings such as aluminum and so on are used is described, however, in the preferred embodiment 3, a capacitor formed in a multilayer wiring structure in which a damascene structure using cupper (Cu) is applied is described.

Figure 5:
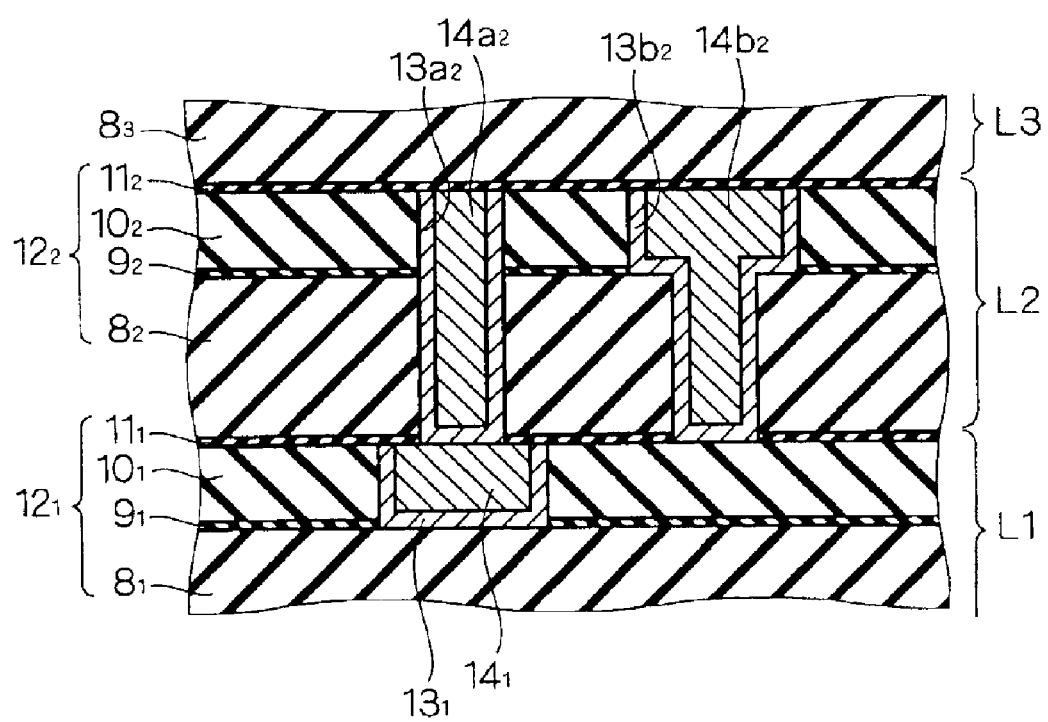
FIG. 5 is a cross-sectional view illustrating a structure of the capacitor according to a preferred embodiment 3 of the present invention.

FIG. 5 is a cross-sectional view illustrating a structure of the capacitor according to the preferred embodiment 3 of the present invention. In FIG. 5, a mere structure of the capacitor forming region of the semiconductor device is illustrated. An interlayer insulating film $12_1$ of the wiring layer L1 has a structure which insulating films $8_1$ to $11_1$ are laminated in this order. In the same way, an interlayer insulating film $12_2$ of the wiring layer L2 has a structure which insulating films $8_2$ to $11_2$ are laminated in this order. On the insulating film $11_2$, a insulating film $8_3$ which the wiring layer L3 has is formed.

The insulating films $8_1$ to $8_3$, $10_1$ and $10_2$ are single-layer films such as P-TEOS (Plasma Tetra Ethyl Ortho Silicate), PEOX (Plasma Enhanced Oxide), PESiN (Plasma Enhanced Nitride), SiON, HDP (High Density Plasma), $Ta_2O_5$, SOG (Spin On Glass), $O_3$-TEOS, BST (Ba, Sr, $TiO_3$), SiC, SIOC and so on, or multilayer films in which these films are combined. Moreover, a material of the insulating films $9_1$, $9_2$, $11_1$ and $11_2$ is SiN, SiC and so on.

In the wiring layer L1, a wiring part of a first dual damascene structure, which has a barrier metal $13_1$, and a Cu film $14_1$. In the wiring layer L2, a via part of a second dual damascene structure, which has a barrier metal $13a_2$ and a Cu film $14a_2$. The barrier metal $14a_2$ is in contact with an upper surface of the Cu film $14_1$. Moreover, in the wiring layer L2, a wiring part and a via part of a third dual damascene structure, which have a barrier metal $13b_2$ and a Cu film $14b_2$.

The via part of the second dual damascene structure functions as a first electrode of the capacitor, and the via part of the third dual damascene structure functions as a second electrode of the capacitor. Part of the interlayer insulating film $12_2$ which is put between the first electrode and the second electrode functions as a capacitor dielectric film. Moreover, each wiring part of the first dual damascene structure and the wiring part of the third dual damascene structure functions as wirings to operate an electric potential of the first electrode and the second electrode of the capacitor, respectively.

The barrier metals $13_1$, $13a_2$ and $13b_2$ are single-layer films such as Ti, Ta, W, Mo, TiN, TiW, TaN, MoN, W—N, W—Si—N, Ta—Si—N, W—B—N, Ti—Si—N and so on, or multilayer films in which these films are combined.

In the same manner with the preferred embodiments 1 and 2 as described above, a dual damascene structure in the capacitor forming region can be formed by the same process of the dual damascene structure in the transistor forming region (not shown in FIG. 5), by changing a pattern of a photo mask.

Besides, in the above description, a case applying the invention concerning with the present preferred embodiment 3 on the basis of the preferred embodiment 2 described above, however, a case applying it on the basis of the preferred embodiment 1 described above is also applicable.

Even in a case of forming the capacitor in the multilayer wiring structure that the damascene structure is applied such as the capacitor concerning with the present preferred embodiment, the same effect as the preferred embodiments 1 and 2 described above can be obtained.

Preferred Embodiment 4.

Figure 6:
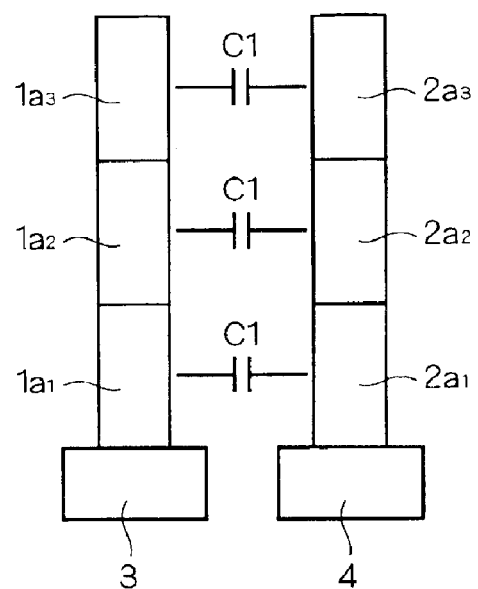
FIG. 6 is a schematic view illustrating a structure of the capacitor according to a preferred embodiment 4 of the present invention.

FIG. 6 is a schematic view illustrating a structure of the capacitor according to the preferred embodiment 4 of the present invention. As for the capacitor concerning with the preferred embodiments 1 to 3 described above, both of the via plugs 1a and 2a which function as the first and the second electrodes of the capacitor are formed merely in the single wiring layer L3 as shown in FIG. 2, for example. In contrast with this, as for the capacitor concerning with the present preferred embodiment 4, plural via plugs $1a_1$ to $1a_3$ and $2a_1$ to $2a_3$ which belong to laminated plural wiring layers compose respectively the first and the second electrodes of the capacitor by connecting continuously in an upper and a lower directions as shown in FIG. 6. "The upper and the lower directions" here means directions in which the plural wirings layers are laminated. The wirings 3 and 4 are connected solely with each lower surface of the via plugs $1a_1$ and $2a_1$, and the wiring are not formed between via plugs which are in a row (for example, between the via plug $1a_1$, and the via plug $1a_2$).

Besides, in FIG. 6, an example that the first electrode and the second electrode of the capacitor are respectively formed by the via plugs $1a_1$ to $1a_3$ and $2a_1$ to $2a_3$ of three layers is illustrated, however, the number of the laminated layers of the via plugs has only to be two or larger. However, the least upper bound of the number of the laminated layers of the via plugs is supposed to be the number of the wiring layers which the multilayer wiring structure includes.

Figure 7:
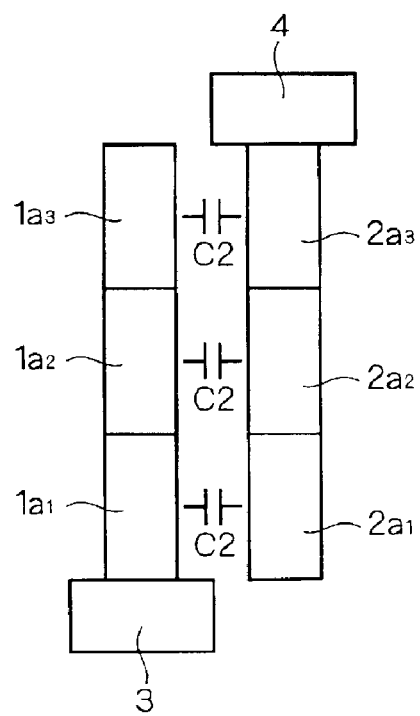
FIG. 7 is a schematic view illustrating an example of a modification of the capacitor according to the preferred embodiment 4 of the present invention.

FIG. 7 is a schematic view illustrating an example of a modification of the capacitor according to the present preferred embodiment 4 corresponding to FIG. 6. In FIG. 6, the structure of the capacitor in case of applying the invention concerning with the present preferred embodiment 4 on the basis of the preferred embodiment 1 described above, however, as shown in FIG. 7, applying the invention corresponding to the present preferred embodiment 4 on the basis of preferred embodiment 2 described above is also applicable. Moreover, although an illustration is omitted, applying it on the basis of the preferred embodiment 3 described above is also applicable.

In such a manner, according to the capacitor concerning with the present preferred embodiment 4, the first and the second electrode of the capacitor are respectively composed by laminating the plural via plugs $1a_1$ to $1a_3$ and $2a_1$ to $2a_3$ in the upper and the lower direction, therefore, the capacitance enlargement of the capacitor can be devised.

Preferred Embodiment 5.

Figure 8:
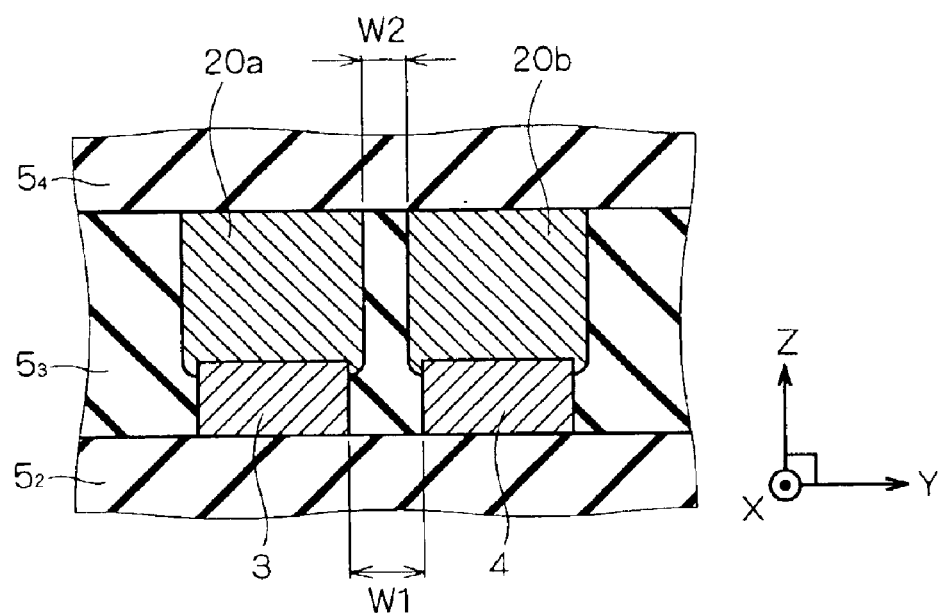
FIG. 8 is a cross-sectional view illustrating a structure of the capacitor according to a preferred embodiment 5 of the present invention.

FIG. 8 is a cross-sectional view illustrating a structure of the capacitor according to a preferred embodiment 5 of the present invention. Via plugs 20a and 20b are respectively formed instead of the via plugs 1a and 1b shown in FIG. 2. The via plugs 20a and 20b are both composed of a metal such as tungsten, aluminum and so on, and function as the first and the second electrodes of the capacitor, respectively. Part of the interlayer insulating film $5_3$ which is put between the via plug 20a and the via plug 20b functions as the capacitor dielectric film. The via plug 20a and 20b are respectively connected with the wirings 3 and 4. A space W2 between the via plug 20a and the via plug 20b according to the Y direction is narrower than a space W1 between the wiring 3 and the wiring 4 according to the Y direction.

Figure 9:
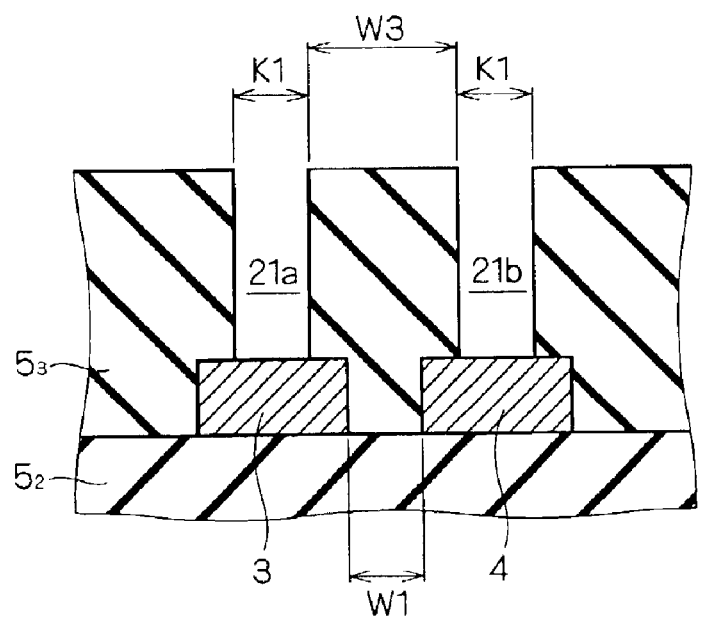
FIGS. 9 and 10 are cross-sectional views each illustrating a method of manufacturing the capacitor shown in FIG. 8 according to process.
Figure 10:
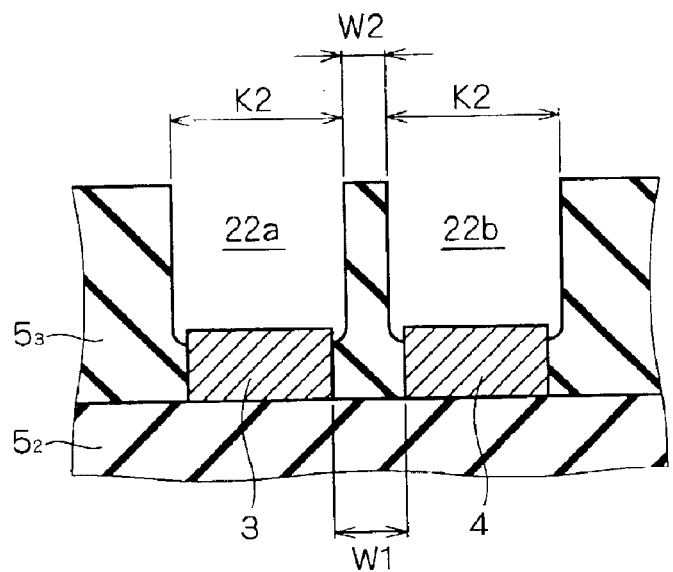

FIGS. 9 and 10 are cross-sectional view each illustrating a method of manufacturing the capacitor shown in FIG. 8 according to process. Referring to FIG. 9, at first, the wirings 3 and 4 are formed on the interlayer insulating film $5_2$. Next, the interlayer insulating film $5_3$ is formed on the interlayer insulating film $5_2$ covering the wirings 3 and 4. Next, by photolithography and an anisotropic dry etching method, via holes 21a and 21b whose diameters are K1 are formed in the interlayer insulating film $5_3$. Lower surfaces of the via holes 21a and 21b are respectively regulated by the upper surfaces of the wirings 3 and 4. Moreover, a space W3 between the via hole 21a and the via hole 21b according to the Y direction is wider than the space W1.

Referring to FIG. 10, next, the interlayer insulating film $5_3$ is eliminated by a predetermined layer thickness from the surface of the interlayer insulating film $5_3$ by a wet etching method or a wet rinsing method. According to this, part of interlayer insulating film $5_3$ which regulates side walls of the via hole 21a and 21b is eliminated, and as a result, the via holes 21a and 21b whose diameters are K1 change into via holes 22a and 22b whose diameters are K2 (>K1). A space between the via hole 22a and the via hole 22b according to the Y direction is W2. After that, the via plugs 20a and 20b shown in FIG. 8 are formed by filling the via holes 22a and 22b by a metal film such as tungsten, aluminum and so on.

Besides, in the above description, a case applying the invention concerning with the present preferred embodiment 5 on the basis of the preferred embodiment 1 described above, however, a case applying it on the basis of the preferred embodiments 2 to 4 described above is also applicable.

In such a manner, according to the capacitor and its manufacturing method concerning with the present preferred embodiment 5, the space W2 between the via plug 20a and the via plug 20b is narrower than spaces between the plugs in the preferred embodiments 1 to 4 described. For example, in case that the space W3 shown in FIG. 9 is an exposure limit in photolithography when the via hole 21a and 21b are formed, the space W2 between the via plug 20a and the via plug 20b can be narrowed than the exposure limit. As a result, the capacitance enlargement of the capacitor can be devised.

Preferred Embodiment 6.

Figure 11:
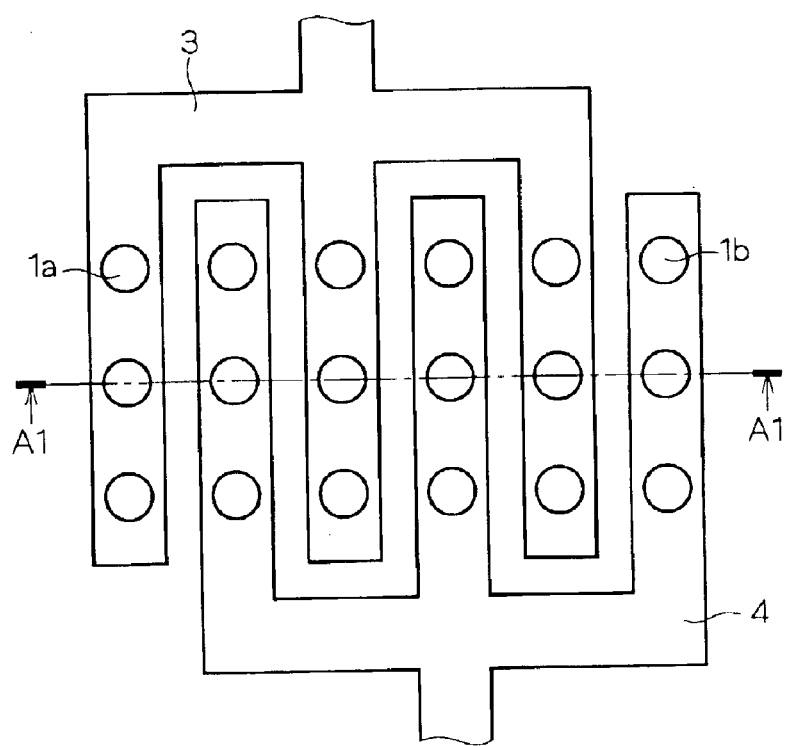
FIG. 11 is a top view illustrating a first structure of the capacitor according to a preferred embodiment 6 of the present invention.

FIG. 11 is a top view illustrating a first structure of the capacitor according to the preferred embodiment 6 of the present invention. Both the wirings 3 and 4 have a pectinate upper surface structure that plural (in the example shown in FIG. 11, three) branch parts connected to a trunk part. Each branch part of the wiring 3 and each branch part of the wiring 4 are arranged alternately. The plural (in the example shown in FIG. 11, three) via plugs 1a are connected with each branch part of the wiring 3. In the same manner, the plural (in the example shown in FIG. 11, three) via plugs 1b are connected with each branch part of the wiring 4.

Figure 12:
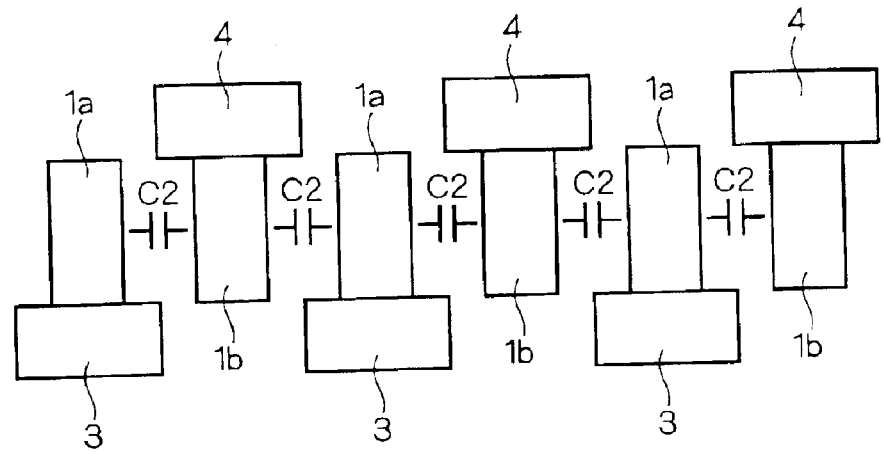
FIG. 12 is a cross-sectional view illustrating a sectional structure of the capacitor shown in FIG. 11.

FIG. 12 is a cross-sectional view illustrating a sectional structure corresponding to a location along a line A1–A1 shown in FIG. 11. Each lower surface of the via plugs 1a is in contact with each upper surface of the branch parts of the wiring 3, and each upper surface of the via plugs 1b is in contact with each lower surface of the branch parts of the wiring 4. Each via plug 1a and each via plug 1b face each other with part of the interlayer insulating film (not shown in FIGS. 11 and 12) between, and the capacitance C2 is composed between each via plug 1a and each via plug 1b, respectively.

Figure 13:
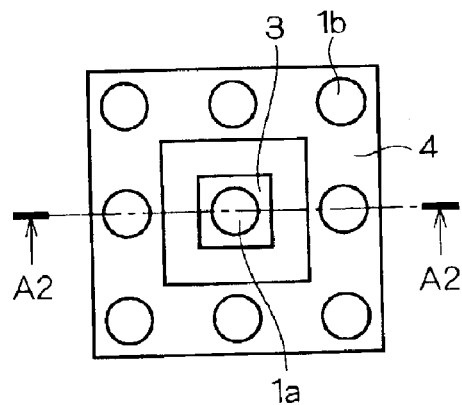
FIG. 13 is a top view illustrating a second structure of the capacitor according to the preferred embodiment 6 of the present invention.

FIG. 13 is a top view illustrating a second structure of the capacitor concerning with the present preferred embodiment 6. The plural (in the example shown in FIG. 13, eight) via plugs 1b are arranged surrounding the via plug 1a. The via plug 1a is connected with the wiring 3, and the plural via plugs 1b are connected with the wiring 4.

Figure 14:
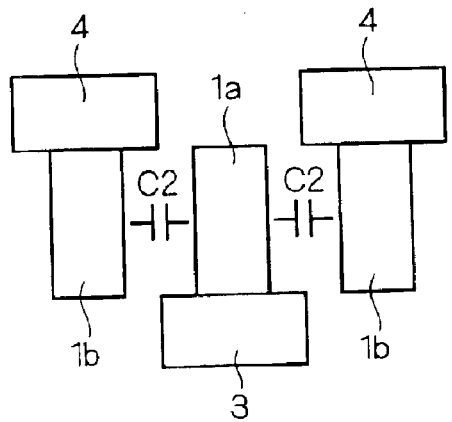
FIG. 14 is a cross-sectional view illustrating a sectional structure of the capacitor shown in FIG. 13.

FIG. 14 is a cross-sectional view illustrating a sectional structure corresponding to a location along a line A2–A2 shown in FIG. 13. The lower surface of the via plug 1a is in contact with the upper surface of the wiring 3, and the upper surface of each via plug 1b is in contact with the lower surface of the wiring 4. The via plug 1a and each via plug 1b face each other with part of the interlayer insulating film (not shown in FIGS. 13 and 14) between, and the capacitance C2 is composed between the via plug 1a and each via plug 1b, respectively.

Besides, in the above description, a case applying the invention concerning with the present preferred embodiment 6 on the basis of the preferred embodiment 2 described above, however, a case applying it on the basis of the preferred embodiments 1 and 3 to 5 corresponding to the first structure described above, and on the basis of the preferred embodiments 3 to 5 corresponding to the second structure described above is also applicable.

According to the capacitor concerning with the present preferred embodiment 6, one via plug 1a composes the capacitance C2 between the plural via plugs 1b which are arranged around the via plug 1a, and therefore, the capacitance enlargement of the capacitor can be devised.

While the invention has been shown and described in detail, the foregoing description is in all aspects illustrative and not restrictive. It is therefore understood that numerous modifications and variations can be devised without departing from the scope of the invention.

What is claimed is:

1. A capacitor formed in a multilayer wiring structure of a semiconductor device, including:

an interlayer insulating film;

at least one first via plug formed in said interlayer insulating film and forming a first electrode of said capacitor;

at least one second via plug formed in said interlayer insulating film, facing said first via plug with part of said interlayer film therebetween and forming a second electrode of said capacitor;

a first wiring connected with only one of an upper surface and a lower surface of said first via plug; and a second wiring connected with only one of an upper surface and a lower surface of said second via plug.

2. The capacitor according to claim 1, wherein said first wiring is connected with said upper surface of said first via plug, and said second wiring is connected with said lower surface of said second via plug.

3. The capacitor according to claim 1, wherein said first and second via plugs are continuously formed extending over a plural wiring layers included in said multilayer wiring structure, respectively.

4. The capacitor according to claim 1, wherein a space between said first via plug and said second via plug corresponding to a predetermined direction is narrower than a space between said first wiring and said second wiring corresponding to said predetermined direction.

5. The capacitor according to claim 1, further comprising plural first via plugs and plural second via plugs, wherein both said first arid second wirings include an upper surface structure and plural branch parts connected to a trunk part, each of said plural branch parts of said first wiring and each of said plural branch parts of said second wiring are arranged alternately, each of said plural branch parts of said first wiring is connected with said plural first via plugs, and each of said plural branch parts of said second wiring is connected with said plural second via plugs.

6. The capacitor according to claim 1, further comprising plural second plugs, wherein said plural second via plugs are arranged surrounding said first via plug.

7. The capacitor according to claim 1, wherein said part of said interlayer insulating film functions as a capacitor dielectric film of said capacitor.

* * * * *